(12) United States Patent
Liu

(10) Patent No.: US 9,236,008 B2
(45) Date of Patent: Jan. 12, 2016

(54) SHIFT REGISTER CIRCUIT

(71) Applicant: AU OPTRONICS CORP., Hsin-Chu (TW)

(72) Inventor: Kuang-Hsiang Liu, Hsin-Chu (TW)

(73) Assignee: AU OPTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/280,953

(22) Filed: May 19, 2014

(65) Prior Publication Data

US 2015/0022428 A1 Jan. 22, 2015

(30) Foreign Application Priority Data

Jul. 18, 2013 (TW) .............................. 102125790 A

(51) Int. Cl.
| | |
|---|---|
| *G09G 3/36* | (2006.01) |
| *G09G 3/32* | (2006.01) |
| *G11C 19/28* | (2006.01) |

(52) U.S. Cl.
CPC ............ *G09G 3/3225* (2013.01); *G09G 3/3266* (2013.01); *G11C 19/28* (2013.01); *G11C 19/287* (2013.01); *G09G 3/3233* (2013.01); *G09G 2300/0852* (2013.01); *G09G 2300/0861* (2013.01)

(58) Field of Classification Search
CPC ..... G06F 3/046; G06F 3/041; G06F 3/03545; G06F 3/0416; G09G 2310/0286; G09G 3/3677; G09G 3/3648; G09G 3/3266; G09G 3/3674; G09G 3/3611; G09G 3/32; G09G 3/3225; G09G 3/3233; G09G 2300/0852; G09G 2300/0861; G11C 19/28; G11C 19/287

USPC ....................................................... 377/64–81
See application file for complete search history.

(56) References Cited

U.S. PATENT DOCUMENTS

| | | | |
|---|---|---|---|
| 8,040,302 B2 | 10/2011 | Shin | |
| 8,330,685 B2 | 12/2012 | Park et al. | |
| 2006/0103323 A1 | 5/2006 | Eom et al. | |
| 2011/0193892 A1* | 8/2011 | Eom ..................... | G09G 3/3266 345/690 |
| 2012/0050251 A1* | 3/2012 | Lee ....................... | G09G 3/3291 345/212 |
| 2012/0075259 A1* | 3/2012 | Chung ................. | G09G 3/3266 345/204 |
| 2012/0188290 A1* | 7/2012 | Park ..................... | G09G 3/3266 345/690 |
| 2015/0002377 A1* | 1/2015 | Liu ....................... | G09G 3/3258 345/77 |

FOREIGN PATENT DOCUMENTS

TW I364019 5/2012

* cited by examiner

*Primary Examiner* — Lun-Yi Lao
*Assistant Examiner* — Kelly B Hegarty
(74) *Attorney, Agent, or Firm* — WPAT, PC; Justin King

(57) ABSTRACT

A shift register circuit for driving an OLED display panel is provided. The shift register circuit includes a plurality of circuit stages connected in series. Each circuit stage includes two shift registers and an enable-signal generator circuit. Each shift register includes two transistors, an input unit and a disable unit. The enable-signal generator circuit is configured to generate an enable signal according to the signals at the control terminals of the four transistors in the two shift registers.

13 Claims, 9 Drawing Sheets

1

SHIFT REGISTER CIRCUIT

TECHNICAL FIELD

The present disclosure relates to a field of display apparatus, and more particularly to a shift register circuit adapted to be used with an organic light emitting diode display panel.

BACKGROUND

FIG. 1 is a schematic circuit structure of an organic light emitting diode (OLED) pixel circuit of an organic light emitting diode display panel. As shown, the organic light emitting diode pixel 100 includes transistors 102, 104, 106, 108, 110, 112, capacitors 114, 116 and an organic light emitting diode 118; wherein the transistors 102, 104, 106, 108, 110 and 112 may be implemented by P-type transistors. In addition, as shown in FIG. 1, the configuration of the organic light emitting diode pixel 100 is associated with a supply voltage OVDD, a reference voltage OVSS, a data signal VDATA, a predetermined voltage VINT, scan signals S1, S2 and an enable signal EM. FIG. 2 is a schematic timing sequence diagram of the scan signals S1, S2 and enable signal EM. To drive the organic light emitting diode pixel 100 to display a specific image according to the data signal VDATA, a plurality of series-connected circuit stages, arranged in a shift register circuit (not shown), each are configured to provide a respective group of scan signals S1, S2 and enable signal EM.

In a conventional shift register circuit, each circuit stage may include more than about fifty transistors; accordingly, the conventional shift register circuit may have a complicated circuit design, a large circuit size and a high cost.

SUMMARY

The present disclosure provides a shift register circuit able to provide two scan signals and an enable signal by using about only twenties transistors. Thus, each associated circuit stage has a simpler circuit design, a smaller circuit size and a lower cost.

An embodiment of the disclosure provides a shift register circuit adapted to be used for driving an organic light emitting diode display panel. The shift register circuit includes a plurality of series-connected circuit stages. Each one of the circuit stages includes a first shift register, a second shift register and an enable-signal generator circuit. The first shift register includes a first transistor, a second transistor, a first input unit and a first disable unit. The first transistor includes a first control terminal, a first terminal and a second terminal. The first transistor is configured to have the first terminal thereof for receiving a first clock signal and the second terminal thereof electrically connected to an organic light emitting diode pixel of the organic light emitting diode display panel, wherein the second terminal is referred to as an output terminal of the first shift register. The second transistor includes a second control terminal, a third terminal and a fourth terminal. The second transistor is configured to have the third terminal thereof electrically connected to the second terminal of the first transistor and the fourth terminal thereof electrically connected to a first reference voltage. The first input unit is electrically connected to a previous circuit stage and the first control terminal. The first input unit is configured to receive at least an input signal and accordingly charge the first control terminal and thereby further controlling the first transistor to output, through the second terminal thereof, a first scan signal to the organic light emitting diode pixel based on a turn-on/turn-off status of the first transistor, wherein the one or more first input signals received by the first input unit include a second scan signal outputted from the first shift resister in the previous circuit stage. The first disable unit is electrically connected to the first control terminal, the second control terminal and the first reference voltage. The first disable unit is configured to selectively electrically connect the first control terminal and the second control terminal to the first reference voltage according to at least a control signal. The second shift register includes a third transistor, a fourth transistor, a second input unit and a second disable unit. The third transistor includes a third control terminal, a fifth terminal and a sixth terminal. The third transistor is configured to have the fifth terminal thereof for receiving a signal inverted to the first clock signal and the sixth terminal thereof electrically connected to the organic light emitting diode pixel, wherein the sixth terminal is referred to as an output terminal of the second shift register. The fourth transistor includes a fourth control terminal, a seventh terminal and an eighth terminal. The fourth transistor is configured to have the seventh terminal thereof electrically connected to the sixth terminal of the third transistor and the eighth terminal thereof electrically connected to the first reference voltage. The second input unit is configured to receive the first clock signal and the first scan signal and accordingly charge the third control terminal and thereby further controlling the third transistor to output, through the sixth terminal thereof, a third scan signal to the organic light emitting diode pixel based on a turn-on/turn-off status of the third transistor. The second disable unit is electrically connected to the third control terminal, the fourth control terminal and the first reference voltage. The first disable unit is configured to selectively electrically connect the third control terminal and the fourth control terminal to the first reference voltage according to at least a control signal. The enable-signal generator circuit is electrically connected to the organic light emitting diode pixel, the first control terminal, the second control terminal, the third control terminal and the fourth control terminal. The enable-signal generator circuit is configured to generate an enable signal to the organic light emitting diode pixel according to signals at the first control terminal, the second control terminal, the third control terminal and the fourth control terminal, wherein the enable signal is configured to have an enable period completely covering an enable period of the signal at the second control terminal and an enable period of the signal at the fourth control terminal.

In summary, through implementing each circuit stage in the shift register circuit of the present disclosure by two shift registers with a similar circuit structure and one enable-signal generator circuit, each circuit stage is able to provide two scan signals and an enable signal by using about twenties transistors even the input unit and the disable unit in each shift register have fewer transistors. Thus, the circuit stage of the present disclosure has a simpler circuit design, a smaller circuit size and a lower cost.

BRIEF DESCRIPTION OF THE DRAWINGS

The present disclosure will become more readily apparent to those ordinarily skilled in the art after reviewing the following detailed description and accompanying drawings, in which.

DETAILED DESCRIPTION OF PREFERRED EMBODIMENTS

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 3:
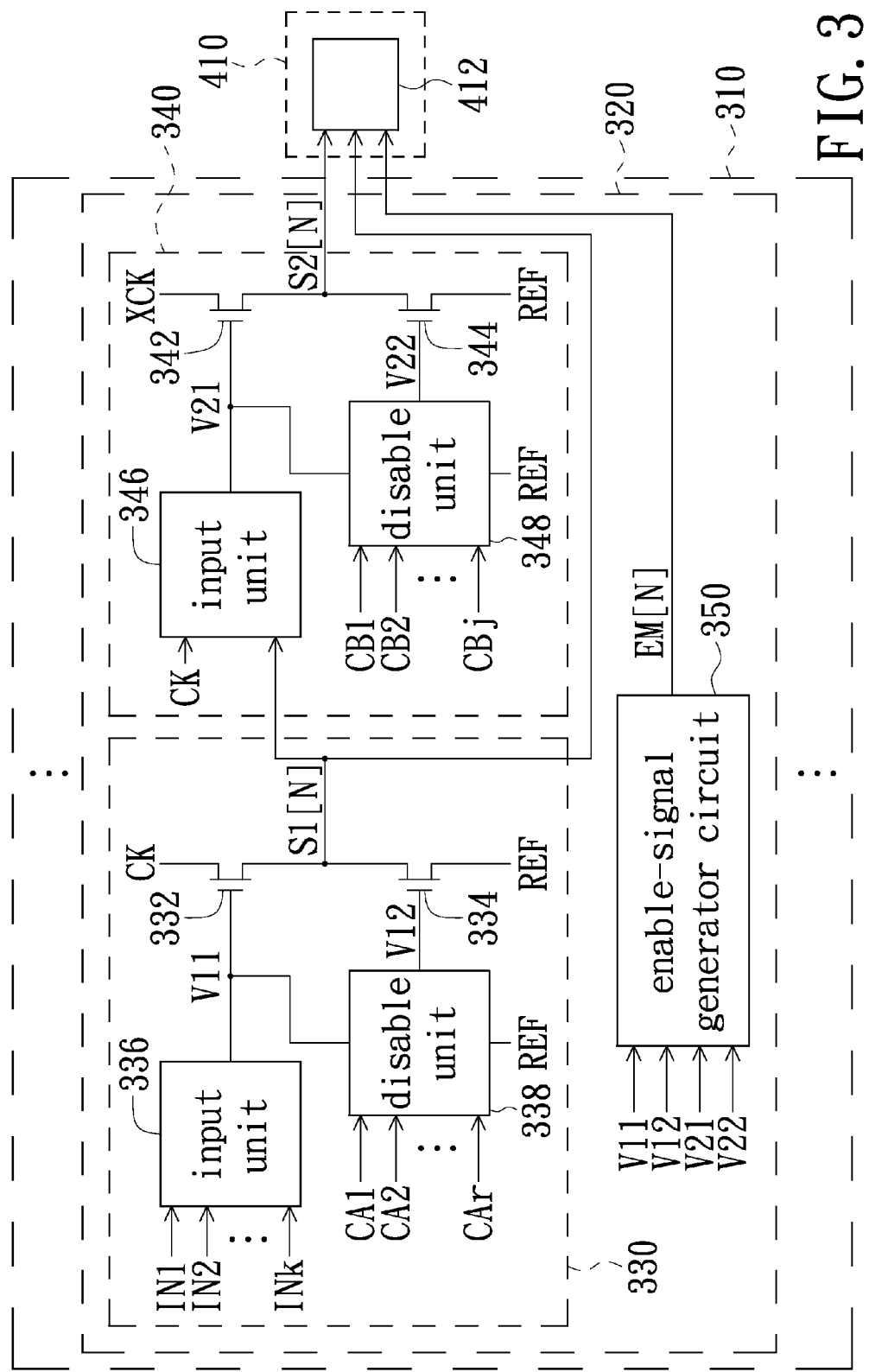
FIG. 3 is a schematic view of a shift register circuit in accordance with an embodiment of the present disclosure.

FIG. 3 is a schematic view of a shift register circuit in accordance with an embodiment of the present disclosure. As shown, the shift register circuit 310 in this embodiment, adapted to be used for driving an organic light emitting diode display panel 410, includes a plurality of series-connected circuit stages 320 (herein only one circuit stage 320 is exemplarily depicted). Each circuit stage 320 includes a first shift register 330, a second shift register 340 and an enable-signal generator circuit 350. For convenience, the circuit stage 320 in FIG. 3 herein is referred to as the Nth circuit stage in the shift register circuit 310, where N is a natural number.

The first shift register 330 includes transistors 332, 334, an input unit 336 and a disable unit 338. In this embodiment, the transistors 332, 334 may be implemented by P-type transistors. In another embodiment, the transistors 332, 334 may be implemented by N-type transistors. In this embodiment, if the transistors 332, 334 are implemented by P-type transistors, it is understood that each one of the transistors 332, 334 is configured to have the gate terminal thereof referred to as a control terminal, the source terminal (having a higher voltage value, compared with that at the drain terminal) thereof referred to as the first terminal, and the drain terminal (having a lower voltage value, compared with that at the source terminal) thereof referred to as the second terminal. Alternatively, if the transistors 332, 334 are implemented by N-type transistors, it is understood that each one of the transistors 332, 334 is configured to have the gate terminal thereof referred to as a control terminal, the drain terminal (having a higher voltage value, compared with that at the source terminal) thereof referred to as the first terminal, and the source terminal (having a lower voltage value, compared with that at the drain terminal) thereof referred to as the second terminal. As mentioned above, the transistor 332 has a control terminal, a first terminal and a second terminal. Specifically, the transistor 332 is configured to have the first terminal thereof for receiving a clock signal CK and the second terminal thereof electrically connected to an organic light emitting diode pixel 412 of the organic light emitting diode display panel 410. In this embodiment, the second terminal of the transistor 332 is also referred to as an output terminal of the first shift register 330.

Figure 1:
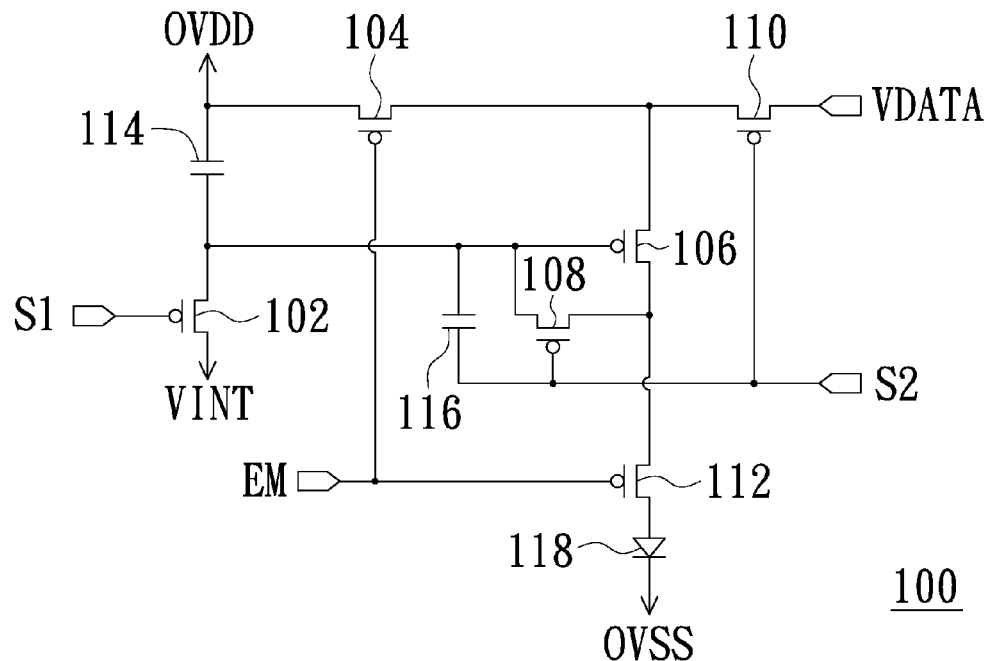
FIG. 1 is a schematic circuit structure of an organic light emitting diode pixel circuit of an organic light emitting diode display panel.

In this embodiment, the organic light emitting diode pixel 412 may have a circuit structure same as that of the organic light emitting diode pixel 100 of FIG. 1, and the present disclosure is not limited thereto. The transistor 334 has a control terminal, a first terminal and a second terminal. Specifically, the transistor 334 is configured to have the first terminal thereof electrically connected to the second terminal of the transistor 332 and the second terminal thereof electrically connected to a reference voltage REF. The input unit 336 is electrically connected to the previous circuit stage (i.e., the $(N-1)_{th}$ circuit stage, not shown) and the control terminal of the transistor 332. Specifically, the input unit 336 is configured to receive at least one input signal (e.g., input signals IN1~INk, where k is a natural number) and accordingly charge the control terminal of the transistor 332 and thereby further controlling the transistor 332 to output, via the second terminal of the transistor 332, a scan signal S1[N] to the organic light emitting diode pixel 412 based on the turn-on/turn-off status of the transistor 332. It is to be noted that the input signals IN1~INk received by the input unit 336 include the scan signal outputted from the first shift resister in the $(N-1)_{th}$ circuit stage, and the details will be described later. The disable unit 338 is electrically connected to the control terminal of the transistor 332, the control terminal of the transistor 334 and the reference voltage REF. Specifically, the disable unit 338 is configured to receive at least one control signal (e.g., control signals CA1~CAr, where r is a natural number) and selectively electrically connect the control terminals of the transistors 332, 334 to the reference voltage REF according to the received control signal(s).

The second shift register 340 includes transistors 342, 344, an input unit 346 and a disable unit 348. In this embodiment, the transistors 342, 344 may be implemented by P-type transistors. In another embodiment, the transistors 332, 334 may be implemented by N-type transistors. The transistor 342 has a control terminal, a first terminal and a second terminal. Specifically, the transistor 342 is configured to have the first terminal thereof for receiving a clock signal XCK and the second terminal thereof electrically connected to the organic light emitting diode pixel 412 of the organic light emitting diode display panel 410; wherein the clock signals CK, XCK are inverted to each other. In this embodiment, the second terminal of the transistor 342 is also referred to as an output terminal of the second shift register 340. The transistor 344 has a control terminal, a first terminal and a second terminal. Specifically, the transistor 344 is configured to have the first terminal thereof electrically connected to the second terminal of the transistor 342 and the second terminal thereof electrically connected to the reference voltage REF. The input unit 346 is configured to receive the clock signal CK and the scan signal S1[N] and accordingly charge the control terminal of the transistor 342 and thereby further controlling the transistor 342 to output, through the second terminal of the transistor 342, a scan signal S2[N] to the organic light emitting diode pixel 412 based on the turn-on/turn-off status of the transistor 342. The disable unit 348 is electrically connected to the control terminal of the transistor 342, the control terminal of the transistor 344 and the reference voltage REF. Specifically, the disable unit 348 is configured to receive at least one control signal (e.g., control signals CB1~CBj, where j is a natural number) and selectively electrically connect the control terminals of the transistors 342, 344 to the reference voltage REF according to the received control signal(s).

The enable-signal generator circuit 350 is electrically connected to the organic light emitting diode pixel 412 and the control terminals of the transistors 332, 334, 342 and 344. Specifically, the enable-signal generator circuit 350 is configured to generate an enable signal EM[N] to the organic light emitting diode pixel 412 according to the signals V11, V12, V21 and V22 at the control terminals of the transistor 332, 334, 342 and 344, respectively. Specifically, the enable signal EM[N] is configured to have an enable period completely covering the enable period of the signal V12 at the control terminal of the transistor 334 and the enable period of the signal V22 at the control terminal of the transistor 344; the details will be described later. It is understood that the enable period herein is referred to the period of a respective signal having a specific logic level. For example, for a P-type transistor, the enable period is referred to as a period of a signal having a logic-high voltage level; and for a N-type transistor, the enable period is referred to as a period of a signal having a logic-low voltage level.

Figure 4:
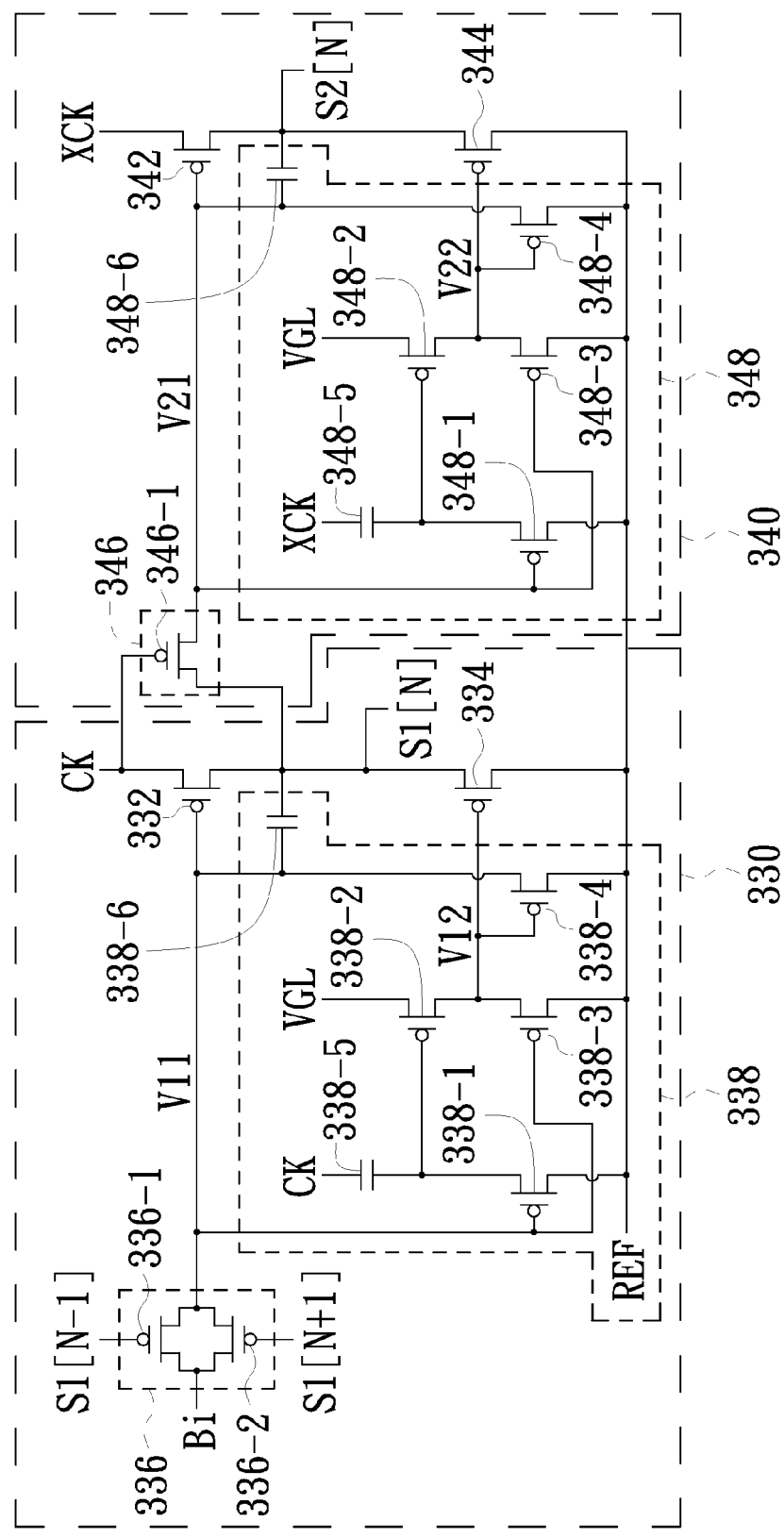
FIG. 4 is an exemplary schematic circuit view of the input units 336, 346 and disable units 338, 348 shown in FIG. 3.

FIG. 4 is an exemplary schematic circuit view of the input units 336, 346 and disable units 338, 348. As shown, the input unit 336 is configured to receive three input signals, which include the scan signal S1[N−1] outputted from the first shift register in the previous circuit stage (i.e., the (N−1)$_{th}$ circuit stage, not shown), the scan signal S1[N+1] outputted from the first shift register in the next circuit stage (i.e., the (N+1)$_{th}$ circuit stage, not shown) and a clock signal Bi. As shown, the input unit 336 includes transistors 336-1, 336-2, which may be implemented by P-type transistors. The transistor 336-1 has a control terminal, a first terminal and a second terminal. Specifically, the transistor 336-1 is configured to have the control terminal thereof for receiving the scan signal S1[N−1], the first terminal thereof for receiving the clock signal Bi, and the second terminal thereof electrically connected to the control terminal of the transistor 332. The transistor 336-2 has a control terminal, a first terminal and a second terminal. Specifically, the transistor 336-2 is configured to have the control terminal thereof for receiving the scan signal S1[N+1], the first terminal of the transistor 336-2 electrically connected to the first terminal of the transistor 336-1, and the second terminal of the transistor 336-2 electrically connected to the control terminal of the transistor 332.

The disable unit 338 is configured to receive two control signals, which include the clock signal CK and the reference voltage VGL (e.g., realized by a low-level gate signal). The disable unit 338 includes transistors 338-1338-4, which may be implemented by P-type transistors, and capacitors 338-5, 338-6. Specifically, the capacitor 338-5 is configured to have one terminal thereof electrically connected to the clock signal CK. The capacitor 338-6 is configured to have one terminal thereof electrically connected to the second terminal of the transistor 332. The transistor 338-1 has a control terminal, a first terminal and a second terminal. Specifically, the transistor 338-1 is configured to have the control terminal thereof electrically connected to the control terminal of the transistor 332, the first terminal thereof electrically connected to the other terminal of the capacitor 338-5, and the second terminal thereof electrically connected to the reference voltage REF (e.g., realized by a high-level gate signal). The transistor 338-2 has a control terminal, a first terminal and a second terminal. Specifically, the transistors 338-2 is configured to have the control terminal thereof electrically connected to the other terminal of the capacitor 338-5 and the first terminal of the transistor 338-2 for receiving the reference voltage VGL. The transistor 338-3 has a control terminal, a first terminal and a second terminal. Specifically, the transistors 338-3 is configured to have the control terminal thereof electrically connected to the control terminal of the transistor 332, the first terminal of the transistor 338-3 electrically connected to the second terminal of the transistor 338-2, and the second terminal of the transistor 338-3 electrically connected to the reference voltage REF. The transistor 338-4 has a control terminal, a first terminal and a second terminal. Specifically, the transistors 338-4 is configured to have the control terminal thereof electrically connected to the control terminal of the transistor 334 and the first terminal of the transistor 338-3, the first terminal of the transistor 338-4 electrically connected to the control terminal of the transistor 332 and the other terminal of the capacitor 338-6, and the second terminal of the transistor 338-4 electrically connected to the reference voltage REF.

The input unit 346 in this embodiment includes a transistor 346-1, which may be implemented by a P-type transistor. The transistor 346-1 has a control terminal, a first terminal and a second terminal. Specifically, the transistor 346-1 is configured to have the control terminal thereof electrically connected to the first terminal of the transistor 332 and the clock signal CK, the first terminal of the transistor 346-1 electrically connected to the second terminal of the transistor 332 to receive the scan signal S1[N], and the second terminal of the transistor 332 electrically connected to the control terminal of the transistor 342.

The disable unit 348, with a circuit structure sane as the disable unit 338 has, is configured to receive two control signals including the clock signal XCK and the reference voltage VGL; wherein the clock signal XCK is inverted to the clock signal CK. The disable unit 348 includes transistors 348-1348-4, which may be implemented by P-type transistors, and capacitors 348-5, 348-6. Specifically, the capacitor 348-5 is configured to have one terminal thereof electrically connected to the clock signal XCK. The capacitor 348-6 is configured to have one terminal thereof electrically connected to the second terminal of the transistor 342. The transistor 348-1 has a control terminal, a first terminal and a second terminal. Specifically, the transistor 348-1 is configured to have the control terminal thereof electrically connected to the control terminal of the transistor 342, the first terminal of the transistor 348-1 electrically connected to the other terminal of the capacitor 348-5, and the second terminal of the transistor 348-1 electrically connected to the reference voltage REF. The transistor 348-2 has a control terminal, a first terminal and a second terminal. Specifically, the transistors 348-2 is configured to have the control terminal thereof electrically connected to the other terminal of the capacitor 348-5 and the first terminal of the transistor 348-2 for receiving the reference voltage VGL. The transistor 348-3 has a control terminal, a first terminal and a second terminal. Specifically, the transistor 348-3 is configured to have the control terminal thereof electrically connected to the control terminal of the transistor 342, the first terminal of the transistor 348-3 electrically connected to the second terminal of the transistor 348-2, and the second terminal of the transistor 348-3 electrically connected to the reference voltage REF. The transistor 348-4 has a control terminal, a first terminal and a second terminal. Specifically, the transistor 348-4 is configured to have the control terminal thereof electrically connected to the control terminal of the transistor 344 and the first terminal of the transistor 348-3, the first terminal of the transistors 348-4 electrically connected to the control terminal of the transistor 342 and the other terminal of the capacitor 348-6, and the second terminal of the transistors 348-4 electrically connected to the reference voltage REF.

Figure 5:
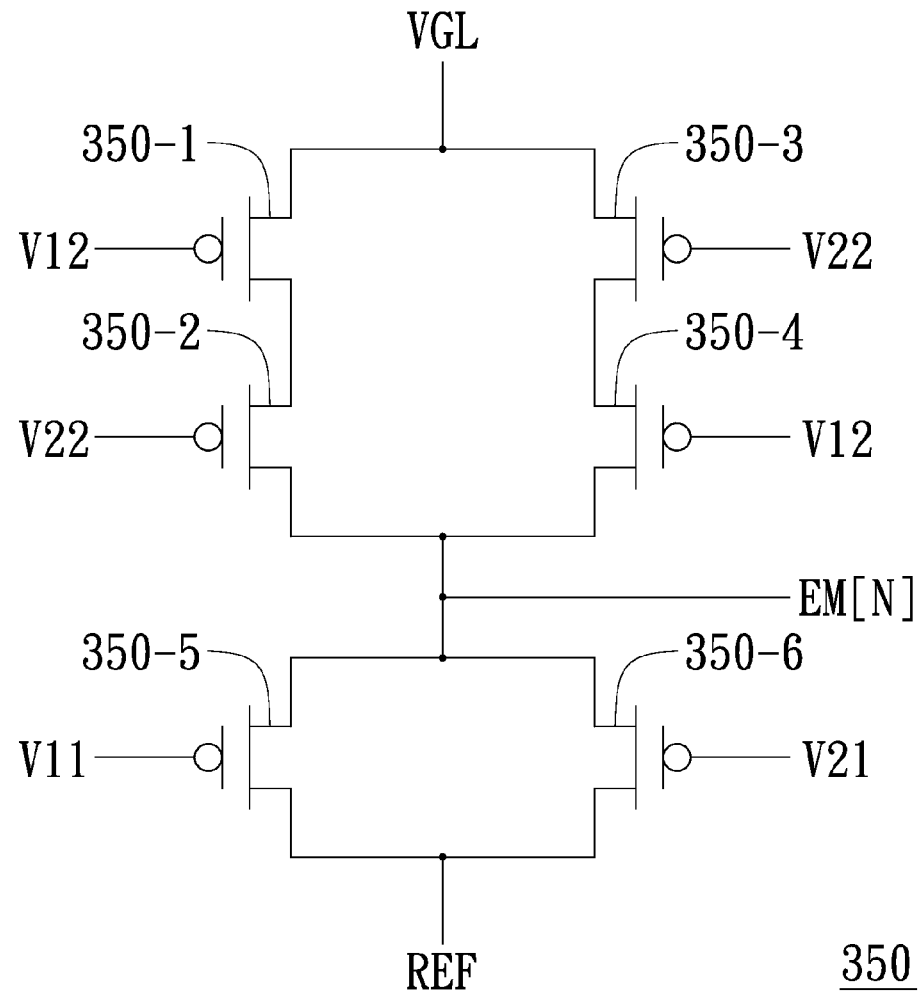
FIG. 5 is an exemplary schematic circuit view of the enable-signal generator circuit 350 shown in FIG. 3.

FIG. 5 is an exemplary schematic circuit view of the enable-signal generator circuit 350. As shown, the enable-signal generator circuit 350 includes transistors 350-1~350-6, which may be implemented by P-type transistors. The transistor 350-1 has a control terminal, a first terminal and a second terminal. Specifically, the transistor 350-1 is configured to have the control terminal thereof electrically connected to the control terminal of the transistor 334 (FIG. 4) and from which to receive the signal V12, and the first terminal thereof electrically connected to the reference voltage VGL. The transistor 350-2 has a control terminal, a first terminal and a second terminal. Specifically, the transistor 350-2 is configured to have the control terminal thereof electrically connected to the control terminal of the transistor 344 (FIG. 4) and from which to receive the signal V22, the first terminal of the transistor 350-2 electrically connected to the second terminal of the transistor 350-1, and the second terminal of the transistor 350-2 for outputting the enable signal EM[N].

The transistor 350-3 has a control terminal, a first terminal and a second terminal. Specifically, the transistor 350-3 is configured to have the control terminal thereof electrically connected to the control terminal of the transistor 344 (FIG. 4) and from which to receive the signal V22, and the first terminal of the transistor 350-3 electrically connected to the first terminal of the transistor 350-1 and the reference voltage VGL. The transistor 350-4 has a control terminal, a first terminal and a second terminal. Specifically, the transistor 350-4 is configured to have the control terminal thereof electrically connected to the control terminal of the transistor 334 (FIG. 4) and from which to receive the signal V12, the first terminal of the transistor 350-4 electrically connected to the second terminal of the transistor 350-3, and the second terminal of the transistor 350-4 electrically connected to the second terminal of the transistor 350-2. The transistor 350-5 has a control terminal, a first terminal and a second terminal. Specifically, the transistor 350-5 is configured to have the control terminal thereof electrically connected to the control terminal of the transistor 332 (FIG. 4) and from which to receive the signal V11, and the first terminal of the transistor 350-5 electrically connected to the second terminal of the transistor 350-2. The transistor 350-6 has a control terminal, a first terminal and a second terminal. Specifically, the transistor 350-6 is configured to have the control terminal thereof electrically connected to the control terminal of the transistor 342 (FIG. 4) and from which to receive the signal V21, the first terminal of the transistor 350-6 electrically connected to the second terminal of the transistor 350-4, and the second terminal of the transistor 350-6 electrically connected to the second terminal of the transistor 350-5 and the reference voltage REF. In this embodiment, the reference voltage VEF may be realized by a high-level gate signal. It is to be noted that, due to the transistors 350-3, 350-4 and the transistors 350-1, 350-2 have the same respective functions and are arranged symmetrically, only one pair of transistors 350-3, 350-4 (or, one pair of transistors 350-1, 350-2) is needed in the enable-signal generator circuit 350; accordingly, each circuit stage may need 21 transistors only in this embodiment.

Figure 2:
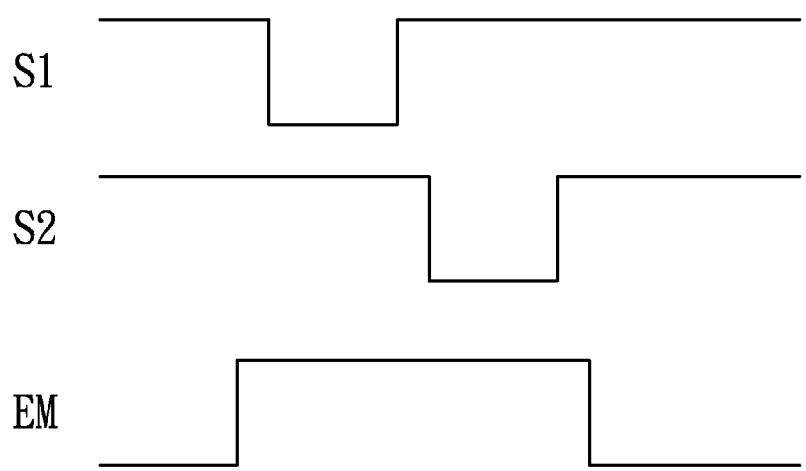
FIG. 2 is a schematic timing sequence diagram of scan signals S1, S2 and enable signal EM associated with the circuit structure shown in FIG. 1.
Figure 6:
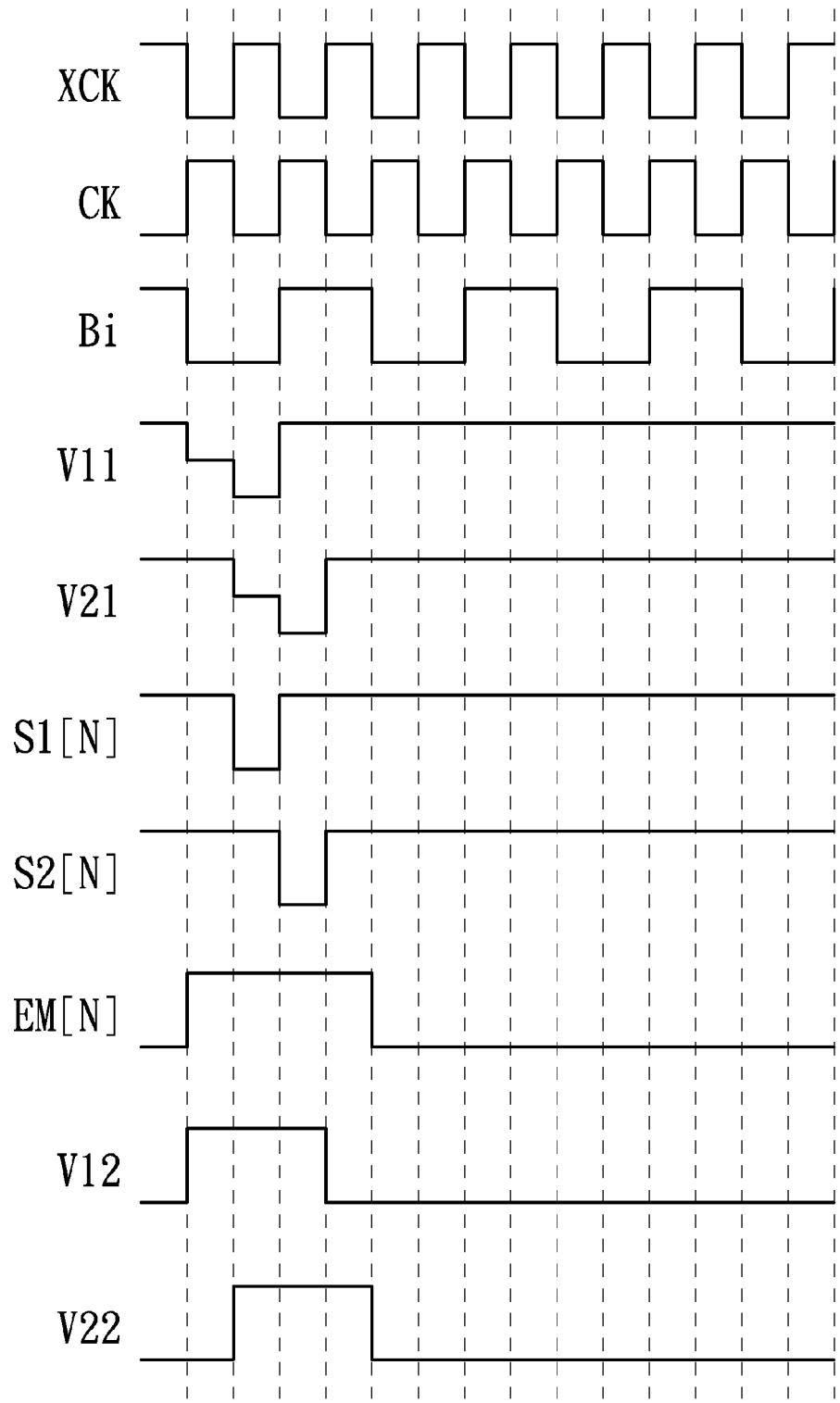
FIG. 6 is a schematic timing sequence diagram of the signals associated with the circuits of FIGS. 4 and 5.

FIG. 6 is a schematic timing sequence diagram of the signals associated with the circuits of FIGS. 4 and 5. As shown, the enable signal EM[N] is configured to have an enable period completely covering that of the signal V12 at the control terminal of the transistor 334 and that of the signal V22 at the control terminal of the transistor 344; wherein the signals EM[N], V12 and V22 have an enable period when having a high level if the transistors 334, 344 are P-type transistors. It is to be noted that the enable signal EM[N] may be configured to have a specific enable period by performing a logic control via the signals V11, V12. Compared with the enable signal EM shown in FIG. 2, the enable signal EM[N] shown in FIG. 6 has an enable period twice the enable signal EM has. Thus, the enable signal EM[N] makes the related transistors have a better ON/OFF performance as well as a reasonable circuit size. The enable period of the enable signal EM[N] is as twice as the union of the enable period of the scan signals s1 [N] and the enable period of the scan signals s2[N]. In addition, it is understood that the signals EM[N], V12 and V22 have an enable period when having a low level if the transistors 334, 344 are N-type transistors.

Figure 7:
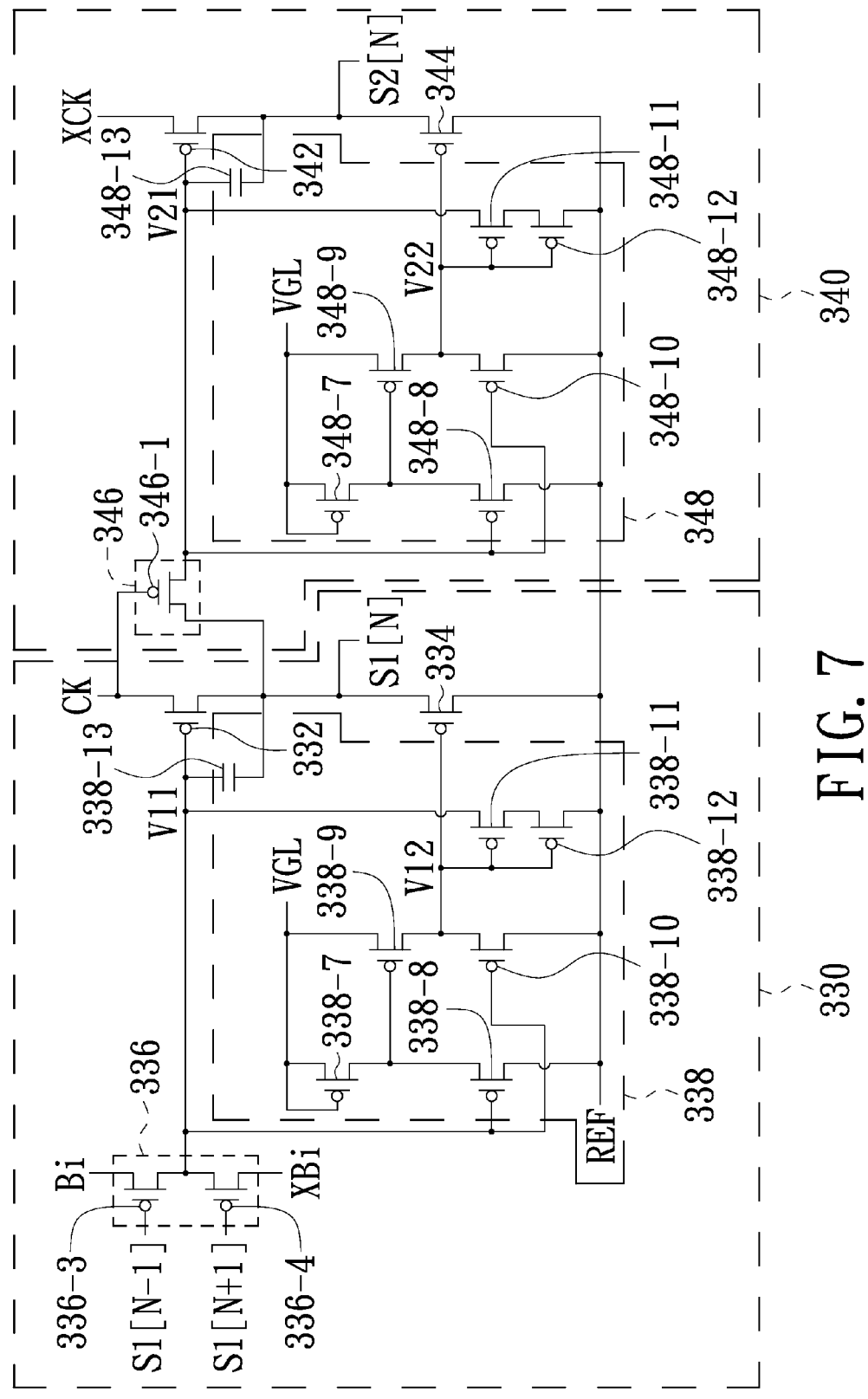
FIG. 7 is another exemplary schematic circuit view of the input unit 336 and disable units 338, 348 shown in FIG. 3.

FIG. 7 is another exemplary schematic circuit view of the input unit 336 and disable units 338, 348. As shown, the input unit 336 is configured to receive four input signals, which include the scan signal S1[N−1] outputted from the first shift register in the previous circuit stage (i.e., the $(N-1)_{th}$ circuit stage, not shown), the scan signal S1[N+1] outputted from the first shift register in the next circuit stage (i.e., the $(N+1)_{th}$ circuit stage, not shown), the clock signal Bi and the clock signal XBi; wherein the clock signals Bi and XBi are inverted to each other. In this embodiment, the input unit 336 includes transistors 336-3, 336-4, which may be implemented by P-type transistors. The transistor 336-3 has a control terminal, a first terminal and a second terminal. Specifically, the transistor 336-3 is configured to have the control terminal thereof for receiving the scan signal S1[N−1], the first terminal of the transistor 336-3 for receiving the clock signal Bi, and the second terminal of the transistor 336-3 electrically connected to the control terminal of the transistor 332. The transistor 336-4 has a control terminal, a first terminal and a second terminal. Specifically, the transistor 336-4 is configured to have the control terminal thereof for receiving the scan signal S1[N+1], the first terminal of the transistor 336-4 electrically connected to the control terminal of the transistor 332, and the second terminal of the transistor 33604 for receiving the clock signal XBi.

The disable unit 338 is configured to receive a control signal, which may be realized by the reference voltage VGL. The disable unit 338 includes transistors 338-7~338-12, which may be implemented by P-type transistors, and a capacitor 338-13. Specifically, the capacitor 338-13 is configured to be electrically connected between the control terminal and the second terminal of the transistor 332. The transistor 338-7 has a control terminal, a first terminal and a second terminal. Specifically, the transistor 338-7 is configured to have the control terminal and the first terminal of the transistor 338-7 electrically connected to the reference voltage VGL. The transistor 338-8 has a control terminal, a first terminal and a second terminal. Specifically, the transistor 338-8 is configured to have the control terminal thereof electrically connected to the control terminal of the transistor 332, the first terminal of the transistor 338-8 electrically connected to the second terminal of the transistor 338-7, and the second terminal of the transistor 338-8 electrically connected to the reference voltage REF. In this embodiment, the reference voltage REF may be realized by a high-level gate signal.

The transistor 338-9 has a control terminal, a first terminal and a second terminal. Specifically, the transistors 338-9 is configured to have the control terminal thereof electrically connected to the second terminal of the transistor 338-7, the first terminal of the transistors 338-9 electrically connected to the reference voltage VGL, and the second terminal of the transistors 338-9 electrically connected to the control terminal of the transistor 334. The transistor 338-10 has a control terminal, a first terminal and a second terminal. Specifically, the transistor 338-10 is configured to have the control terminal thereof electrically connected to the control terminal of the transistor 332, the first terminal of the transistor 338-10 electrically connected to the second terminal of the transistor 338-9, and the second terminal of the transistor 338-10 electrically connected to the reference voltage REF. The transistor 338-11 has a control terminal, a first terminal and a second terminal. Specifically, the transistor 338-11 is configured to have the control terminal thereof electrically connected to the second terminal of the transistor 338-9 and the control terminal of the transistor 334, and the first terminal of the transistor 338-11 electrically connected to the control terminal of the transistor 332. The transistor 338-12 has a control terminal, a first terminal and a second terminal. Specifically, the transistor 338-12 is configured to have the control terminal thereof electrically connected to the control terminal of the transistor 338-11, the first terminal of the transistor 338-12 electrically connected to the second terminal of the transistor 338-11, and the second terminal of the transistor 338-12 electrically connected to the reference voltage REF.

Same as the illustration in FIG. 4, the input unit 346 in this embodiment is also implemented by the transistor 346-1 and no redundant detail is to be given herein. The disable unit 348 in this embodiment is configured to receive a control signal, which may be realized by the reference voltage VGL. The disable unit 348 includes transistors 348-7~348-12, which may be implemented by P-type transistors, and a capacitor 348-13. Specifically, the capacitor 348-13 is configured to be electrically connected between the control terminal and the second terminal of the transistor 342. The transistor 348-7 has a control terminal, a first terminal and a second terminal. Specifically, the transistor 348-7 is configured to have the control terminal and the first terminal of the transistor 348-7 electrically connected to the reference voltage VGL. The transistor 348-8 has a control terminal, a first terminal and a second terminal. Specifically, the transistor 348-8 is configured to have the control terminal thereof electrically connected to the control terminal of the transistor 342, the first terminal of the transistor 348-8 electrically connected to the second terminal of the transistor 348-7, and the second terminal of the transistor 348-8 electrically connected to the reference voltage REF. In this embodiment, the reference voltage REF may be realized by a high-level gate signal.

The transistor 348-9 has a control terminal, a first terminal and a second terminal. Specifically, the transistor 348-9 is configured to have the control terminal thereof electrically connected to the second terminal of the transistor 348-7, the first terminal of the transistor 348-9 electrically connected to the reference voltage VGL, and the second terminal of the transistor 348-9 electrically connected to the control terminal of the transistor 344. The transistor 348-10 has a control terminal, a first terminal and a second terminal. Specifically, the transistor 348-10 is configured to have the control terminal thereof electrically connected to the control terminal of the transistor 342, the first terminal of the transistor 348-10 electrically connected to the second terminal of the transistor 348-9, and the second terminal of the transistor 348-10 electrically connected to the reference voltage REF. The transistor 348-11 has a control terminal, a first terminal and a second terminal. Specifically, the transistor 348-11 is configured to have the control terminal thereof electrically connected to the second terminal of the transistor 348-9 and the control terminal of the transistor 344, and the first terminal of the transistor 348-11 electrically connected to the control terminal of the transistor 342. The transistor 348-12 has a control terminal, a first terminal and a second terminal. Specifically, the transistor 348-12 is configured to have the control terminal thereof electrically connected to the control terminal of the transistor 348-11, the first terminal of the transistor 348-12 electrically connected to the second terminal of the transistor 348-11, and the second terminal of the transistor 348-12 electrically connected to the reference voltage REF. As illustrated in FIGS. 7, 5, it is to be noted that each circuit stage may need about only 25 transistors in this embodiment.

It is to be noted that the input unit 336 of the first shift register 330 may have other circuit structures rather than that illustrated in FIGS. 4, 7. Another three circuit structures of the input unit 336 will be described in follow as illustrated in FIGS. 8-10, respectively.

Figure 8:
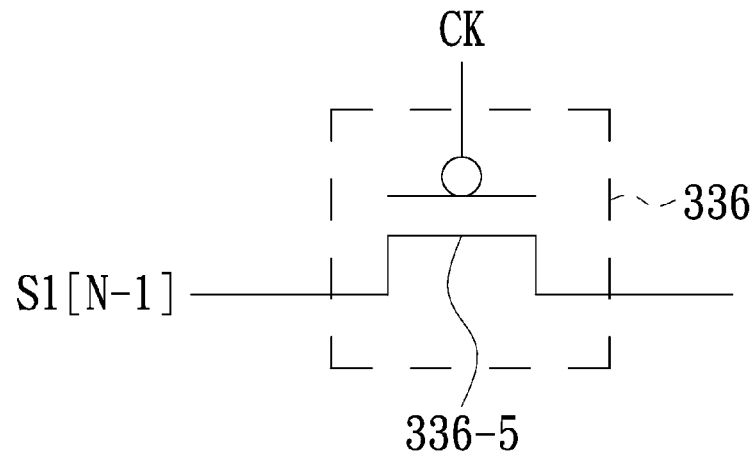
FIGS. 8-10 are another three exemplary schematic circuit views of the input unit 336 shown in FIG. 3.

FIG. 8 is an exemplary schematic circuit view of the input unit 336 in one embodiment. As shown, the input unit 336 in this embodiment is configured to receive two input signals, which include the scan signal S1[N−1] outputted from the first shift register in the previous circuit stage (i.e., the $(N-1)_{th}$ circuit stage, not shown) and the clock signal CK. In this embodiment, the input unit 336 includes a transistor 336-5, which may be implemented by a P-type transistor. The transistor 336-5 has a control terminal, a first terminal and a second terminal. Specifically, the transistor 336-5 is configured to have the control terminal thereof for receiving the clock signal CK, the first terminal of the transistor 336-5 for receiving the scan signal S1[N−1], and the second terminal of the transistor 336-5 electrically connected to the control terminal of the transistor 332 (FIGS. 4, 7).

Figure 9:
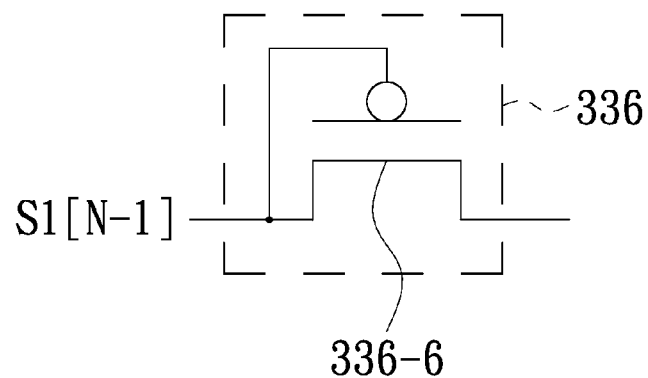

FIG. 9 is another exemplary schematic circuit view of the input unit 336 in one embodiment. As shown, the input unit 336 in this embodiment is configured to receive an input signal, which include the scan signal S1[N−1] outputted from the first shift register in the previous circuit stage (i.e., the $(N-1)_{th}$ circuit stage, not shown). In this embodiment, the input unit 336 includes a transistor 336-6, which may be implemented by a P-type transistor. The transistor 336-6 has a control terminal, a first terminal and a second terminal. Specifically, the transistor 336-6 is configured to have the control terminal electrically connected to the first terminal thereof, the first terminal of the transistor 336-6 for receiving the scan signal S1[N−1], and the second terminal of the transistor 336-6 electrically connected to the control terminal of the transistor 332 (FIGS. 4, 7).

Figure 10:
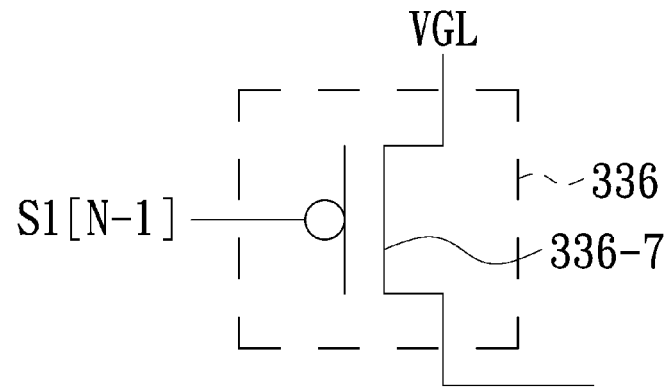

FIG. 10 is still another exemplary schematic circuit view of the input unit 336 in one embodiment. As shown, the input unit 336 in this embodiment is configured to receive two input signals, which include the scan signal S1[N−1] outputted from the first shift register in the previous circuit stage (i.e., the $(N-1)_{th}$ circuit stage, not shown) and the reference voltage VGL. In this embodiment, the input unit 336 includes a transistor 336-7, which may be implemented by a P-type transistor. The transistor 336-7 has a control terminal, a first terminal and a second terminal. Specifically, the transistor 336-7 is configured to have the first terminal thereof electrically connected to the reference voltage VGL, the control terminal of the transistor 336-7 for receiving the scan signal S1[N−1], and the second terminal of the transistor 336-7 electrically connected to the control terminal of the transistor 332 (FIGS. 4, 7).

The circuit stage 320 in each one of the aforementioned embodiments is implemented by two shifter registers (i.e., the first shift register 330 and the second shift register 340). However, it is understood that the circuit stage may be implemented by three or more than three shift registers in other embodiments.

Figure 11:
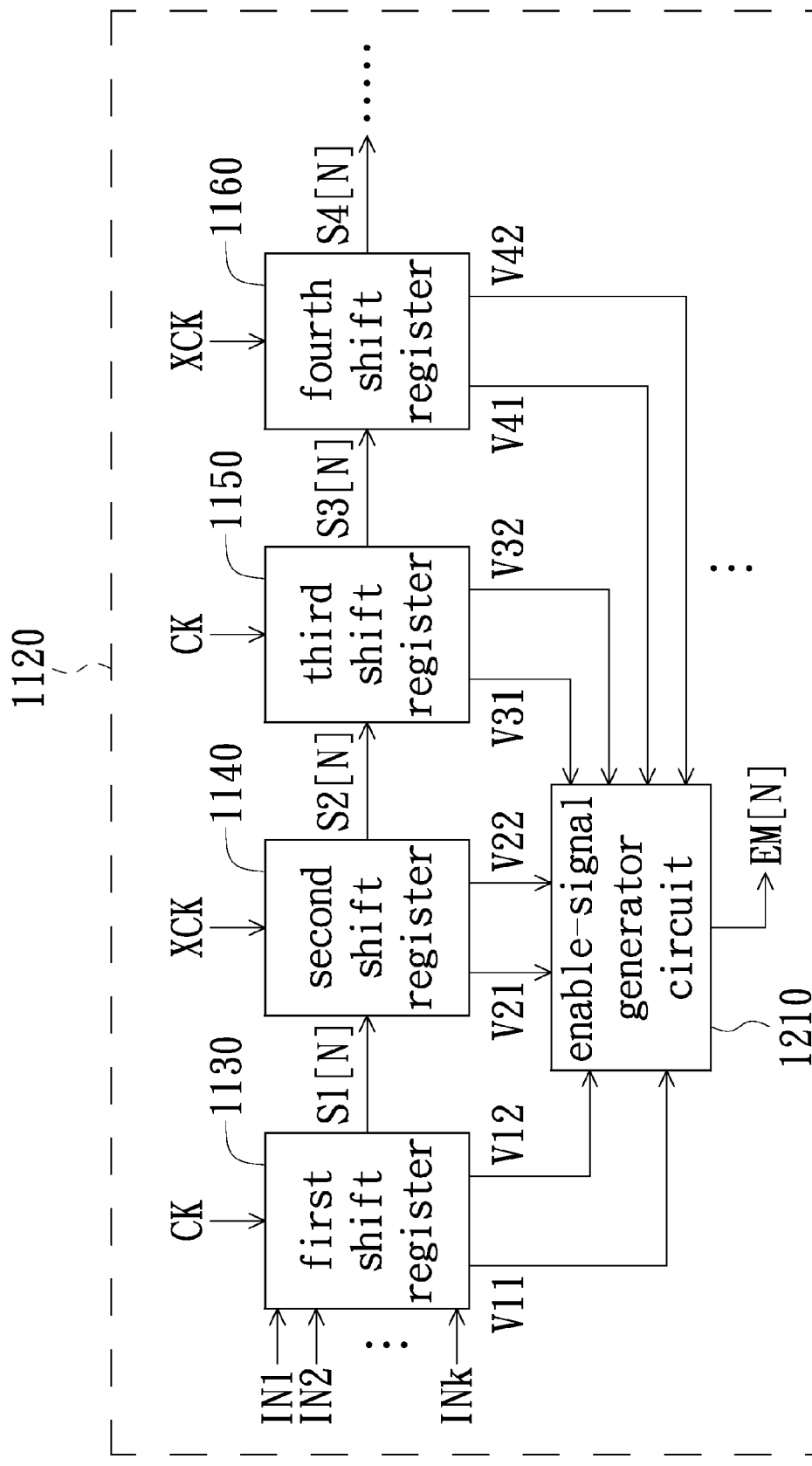
FIG. 11 is a schematic view of a circuit stage implemented by at least three shift registers in accordance with an embodiment.

FIG. 11 is a schematic view of a circuit stage implemented by more than three shift registers (herein four shift registers are exemplarily depicted) in accordance with an embodiment. As shown, the circuit stage 1120 includes a first shift register 1130, a second shift register 1140, a third shift register 1150, a fourth shift register 1160 and an enable-signal generator circuit 1210. The first shift register 1130 is configured to receive a clock signal CK and at least one input signal (e.g., input signals IN1~INk, where k is a natural number) and to deliver the signals V11, V12, generated at the control terminals of the two respective transistors therein (not shown) and for generating the scan signal S1[N], to the enable-signal generator circuit 1210. The second shift register 1140 is configured to receive a clock signal XCK and the scan signal S1[N] and to deliver the signals V21, V22, generated at the control terminals of the two respective transistors therein (not shown) and for generating the scan signal S2[N], to the enable-signal generator circuit 1210; wherein the clock signals CK, XCK are inverted to each other. The third shift register 1150 is configured to receive the clock signal CK and the scan signal S2[N] and to deliver the signals V31, V32, generated at the control terminals of the two respective transistors therein (not shown) and for generating the scan signal S3[N], to the enable-signal generator circuit 1210. The fourth shift register 1160 is configured to receive the clock signal XCK and the scan signal S3[N] and to deliver the signals V41, V42, generated at the control terminals of the two respective transistors therein (not shown) and for generating the scan signal S4[N], to the enable-signal generator circuit 1210. The enable-signal generator circuit 1210 is configured to generate the enable EM[N] according to the received signals outputted from the shift registers (i.e., the signals V11, V12, V21, V22, V31, V32, V41 and V42).

Figure 12:
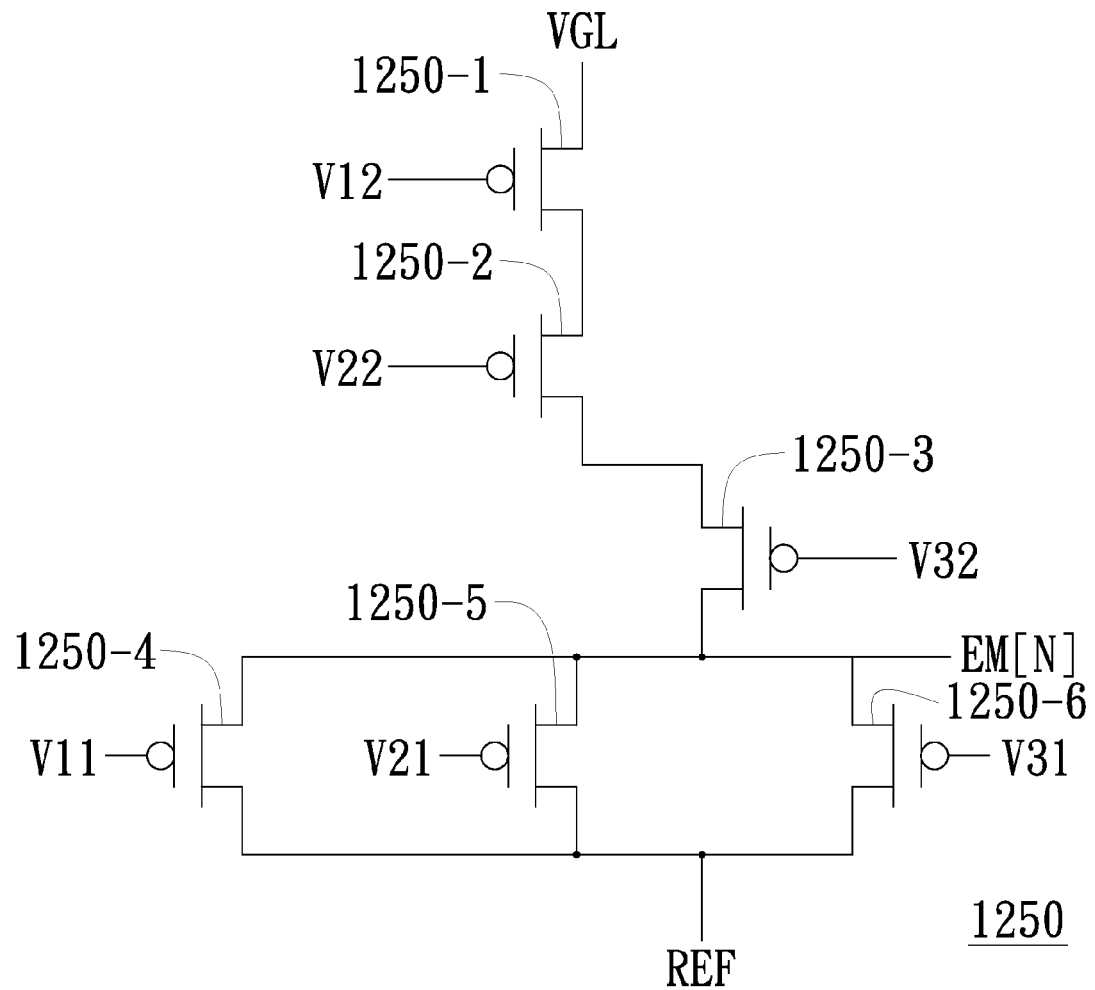
FIG. 12 is a schematic view of an enable-signal generator circuit in a circuit stage implemented by three shift registers in accordance with an embodiment.

FIG. 12 is a schematic view of an enable-signal generator circuit in a circuit stage implemented by three shift registers in accordance with an embodiment. As shown, the enable-signal generator circuit 1250 includes transistors 1250-111250-6, which may be implemented by P-type transistors. In addition, as shown in FIG. 12, the configuration of the enable-signal generator circuit 1250 is associated with a reference voltage VGL (e.g., a low level of a gate signal), a reference voltage REF and an enable signal EM[N]; wherein the reference voltage REF is realized by a high-level gate signal in this embodiment. Specifically, the transistors 1250-1, 1250-2, 1250-3 are configured to output scan signals according to the signals V12, V22, V32 at the control terminals thereof, respectively. Specifically, the signals V12, V22, V32 each is derived from the signal at the control terminal of the respective transistor electrically connected between the output terminal of the respective shift register and the reference voltage REF. For example, the signal V12 is derived from the signal at the control terminal of the transistor 334 which is electrically connected between the output terminal of the respective shift register 330 and the reference voltage REF (FIG. 3); and the signal V22 is derived from the signal at the control terminal of the transistor 344 which is electrically connected between the output terminal of the respective shift register 340 and the reference voltage REF (FIG. 3). The transistors 1250-4, 1250-5, 1250-6 are configured to output scan signals according to the signals V11, V21, V31 at the control terminals thereof, respectively. Specifically, the signals V11, V21, V31 each is derived from the signal at the control terminal of the respective transistor electrically connected between the output terminal of the respective shift register and the clock signal CK (or clock signal XCK). For example, the signal V11 is derived from the signal at the control terminal of the transistor 332 which is electrically connected between the output terminal of the respective shift register 330 and the clock signal CK (FIG. 3); and the signal V21 is derived from the signal at the control terminal of the transistor 342 which is electrically connected between the output terminal of the respective shift register 340 and the clock signal XCK (FIG. 3).

In summary, through implementing each circuit stage in the shift register circuit of the present disclosure by two shift registers with a similar circuit structure and one enable-signal generator circuit, each circuit stage is able to provide scan signals S1, S2 and an enable signal EM by using about twenties transistors even the input unit and the disable unit in each shift register have fewer transistors. Thus, the circuit stage of the present disclosure has a simpler circuit design, a smaller circuit size and a lower cost.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A shift register circuit adapted to be used for driving an organic light emitting diode display panel, the shift register circuit comprising a plurality of series-connected circuit stages, each one of the circuit stages comprising:

a first shift register, comprising:

a first transistor comprising a first control terminal, a first terminal and a second terminal, the first transistor being configured to have the first terminal thereof for receiving a first clock signal and the second terminal thereof electrically connected to an organic light emitting diode pixel of the organic light emitting diode display panel, wherein the second terminal is referred to as an output terminal of the first shift register;

a second transistor comprising a second control terminal, a third terminal and a fourth terminal, the second transistor being configured to have the third terminal thereof electrically connected to the second terminal of the first transistor and the fourth terminal thereof electrically connected to a first reference voltage;

a first input unit electrically connected to a previous circuit stage and the first control terminal, the first input unit being configured to receive at least an input signal and accordingly charge the first control terminal and thereby further controlling the first transistor to output, through the second terminal thereof, a first scan signal to the organic light emitting diode pixel based on a turn-on/turn-off status of the first transistor, wherein the one or more first input signals received by the first input unit comprise a second scan signal outputted from the first shift resister in the previous circuit stage; and a first disable unit electrically connected to the first control terminal, the second control terminal and the first reference voltage, the first disable unit being configured to selectively electrically connect the first control terminal and the second control terminal to the first reference voltage according to at least a control signal;

a second shift register, comprising:

a third transistor comprising a third control terminal, a fifth terminal and a sixth terminal, the third transistor being configured to have the fifth terminal thereof for receiving a signal inverted to the first clock signal and the sixth terminal thereof electrically connected to the organic light emitting diode pixel, wherein the sixth terminal is referred to as an output terminal of the second shift register;

a fourth transistor comprising a fourth control terminal, a seventh terminal and an eighth terminal, the fourth transistor being configured to have the seventh terminal thereof electrically connected to the sixth terminal of the third transistor and the eighth terminal thereof electrically connected to the first reference voltage;

a second input unit configured to receive the first clock signal and the first scan signal and accordingly charge the third control terminal and thereby further controlling the third transistor to output, through the sixth terminal thereof, a third scan signal to the organic light emitting diode pixel based on a turn-on/turn-off status of the third transistor; and a second disable unit electrically connected to the third control terminal, the fourth control terminal and the first reference voltage, the first disable unit being configured to selectively electrically connect the third control terminal and the fourth control terminal to the first reference voltage according to at least a control signal; and an enable-signal generator circuit electrically connected to the organic light emitting diode pixel, the first control terminal, the second control terminal, the third control terminal and the fourth control terminal, the enable-signal generator circuit being configured to generate an enable signal to the organic light emitting diode pixel according to signals at the first control terminal, the second control terminal, the third control terminal and the fourth control terminal, wherein the enable signal is configured to have an enable period completely covering an enable period of the signal at the second control terminal and an enable period of the signal at the fourth control terminal.

2. The shift register circuit according to claim 1, wherein the enable-signal generator circuit comprising:

a fifth transistor comprising a fifth control terminal, a ninth terminal and a tenth terminal, the fifth transistor being configured to have the fifth control terminal thereof electrically connected to either the second control terminal or the fourth control terminal and the ninth terminal thereof electrically connected to a second reference voltage;

a sixth transistor comprising a sixth control terminal, an eleventh terminal and a twelfth terminal, the sixth transistor being configured to have the sixth control terminal thereof electrically connected to either the second control terminal or the fourth control terminal, the eleventh terminal thereof electrically connected to the tenth terminal, and the twelfth terminal thereof for outputting the enable signal;

a seventh transistor comprising a seventh control terminal, a thirteenth terminal and a fourteenth terminal, the seventh transistor being configured to have the seventh control terminal thereof electrically connected to either the first control terminal or the third control terminal and the thirteenth terminal thereof electrically connected to the twelfth terminal; and an eighth transistor comprising an eighth control terminal, a fifteenth terminal and a sixteenth terminal, the eighth transistor being configured to have the eighth control terminal thereof electrically connected to either the first terminal or the third control terminal, the fifteenth terminal thereof electrically connected to the thirteenth terminal, and the sixteenth terminal thereof electrically connected to the fourteenth terminal and the first reference voltage.

3. The shift register circuit according to claim 2, wherein the enable-signal generator circuit further comprising:

a ninth transistor comprising a ninth control terminal, a seventeenth terminal and an eighteenth terminal, the ninth transistor being configured to have the ninth control terminal thereof electrically connected to either the second control terminal or the fourth control terminal and the seventeenth terminal thereof electrically connected to the ninth terminal and the second reference voltage; and a tenth transistor comprising a tenth control terminal, a nineteenth terminal and a twentieth terminal, the tenth transistor being configured to have the tenth control terminal thereof electrically connected to either the second control terminal or the fourth control terminal, the nineteenth terminal thereof electrically connected to the eighteenth terminal, and the twentieth terminal thereof electrically connected to the twelfth terminal.

4. The shift register circuit according to claim 1, wherein the first input unit is configured to receive three input signals including the second scan signal outputted from the first shift register in a previous circuit stage, a fourth scan signal outputted from the first shift register in a next circuit stage and a second clock signal, the first input unit comprising:

a fifth transistor comprising a fifth control terminal, a ninth terminal and a tenth terminal, the fifth transistor being configured to have the fifth control terminal thereof for receiving the second scan signal, the ninth terminal thereof for receiving the second clock signal, and the tenth terminal thereof electrically connected to the first control terminal; and a sixth transistor comprising a sixth control terminal, an eleventh terminal and a twelfth terminal, the sixth transistor being configured to have the sixth control terminal thereof for receiving the fourth scan signal, the eleventh terminal thereof electrically connected to the ninth terminal and the second clock signal, and the twelfth terminal thereof electrically connected to the first control terminal.

5. The shift register circuit according to claim 1, wherein the first input unit is configured to receive four input signals including the second scan signal outputted from the first shift register in a previous circuit stage, a fourth scan signal outputted from the first shift register in a next circuit stage, a second clock signal and an inverted signal of the second clock signal, the first input unit comprising:

a fifth transistor comprising a fifth control terminal, a ninth terminal and a tenth terminal, the fifth transistor being configured to have the fifth control terminal thereof for receiving the second scan signal, the ninth terminal thereof for receiving the second clock signal, and the tenth terminal thereof electrically connected to the first control terminal; and a sixth transistor comprising a sixth control terminal, an eleventh terminal and a twelfth terminal, the sixth transistor being configured to have the sixth control terminal thereof for receiving the fourth scan signal, the eleventh terminal thereof electrically connected to the first control terminal, and the twelfth terminal thereof for receiving the inverted signal.

6. The shift register circuit according to claim 1, wherein the first input unit is configured to receive two input signals including the second scan signal outputted from the first shift register in a previous circuit stage and the first clock signal, the first input unit comprising:

a fifth transistor comprising a fifth control terminal, a ninth terminal and a tenth terminal, the fifth transistor being configured to have the fifth control terminal thereof for receiving the first clock signal, the ninth terminal thereof for receiving the second scan signal, and the tenth terminal thereof electrically connected to the first control terminal.

7. The shift register circuit according to claim 1, wherein the first input unit is configured to receive an input signal including the second scan signal outputted from the first shift register in a previous circuit stage, the first input unit comprising:
 a fifth transistor comprising a fifth control terminal, a ninth terminal and a tenth terminal, the fifth transistor being configured to have the fifth control terminal thereof electrically connected to the ninth terminal, the ninth terminal thereof for receiving the second scan signal, and the tenth terminal thereof electrically connected to the first control terminal.

8. The shift register circuit according to claim 1, wherein the first input unit is configured to receive two input signals including the second scan signal outputted from the first shift register in a previous circuit stage and a first reference voltage, the first input unit comprising:
 a fifth transistor comprising a fifth control terminal, a ninth terminal and a tenth terminal, the fifth transistor being configured to have the fifth control terminal thereof for receiving the second scan signal, the ninth terminal thereof for receiving the second reference voltage, and the tenth terminal thereof electrically connected to the first control terminal.

9. The shift register circuit according to claim 1, wherein the second input unit comprising:
 a fifth transistor comprising a fifth control terminal, a ninth terminal and a tenth terminal, the fifth transistor being configured to have the fifth control terminal thereof electrically connected to the first terminal and the first clock signal, the ninth terminal thereof electrically connected to the second terminal and from which to receive the first scan signal, and the tenth terminal thereof electrically connected to the third control terminal.

10. The shift register circuit according to claim 1, wherein the first disable unit is configured to receive two control signals including the first clock signal and a second reference voltage, the first disable unit comprising:
 a first capacitor configured to have one terminal thereof electrically connected to the first clock signal;
 a second capacitor configured to have one terminal thereof electrically connected to the second terminal;
 a fifth transistor comprising a fifth control terminal, a ninth terminal and a tenth terminal, the fifth transistor being configured to have the fifth control terminal thereof electrically connected to the first control terminal, the ninth terminal thereof electrically connected to the other terminal of the first capacitor, and the tenth terminal thereof electrically connected to the first reference voltage;
 a sixth transistor comprising a sixth control terminal, an eleventh terminal and a twelfth terminal, the sixth transistor being configured to have the sixth control terminal thereof electrically connected to the other terminal of the first capacitor and the eleventh terminal thereof for receiving the second reference voltage;
 a seventh transistor comprising a seventh control terminal, a thirteenth terminal and a fourteenth terminal, the seventh transistor being configured to have the seventh control terminal thereof electrically connected to the first control terminal, the thirteenth terminal thereof electrically connected to the twelfth terminal, and the fourteenth terminal thereof electrically connected to the first reference voltage; and
 an eighth transistor comprising an eighth control terminal, a fifteenth terminal and a sixteenth terminal, the eighth transistor being configured to have the eighth control terminal thereof electrically connected to the second control terminal and the thirteen terminal, the fifteenth terminal thereof electrically connected to the first control terminal and the other terminal of the second capacitor, and the sixteenth terminal thereof electrically connected to the first reference voltage.

11. The shift register circuit according to claim 1, wherein the second disable unit is configured to receive two control signals including an inverted signal of the first clock signal and a second reference voltage, the second disable unit comprising:
 a first capacitor configured to have one terminal thereof electrically connected to the inverted signal of the first clock signal;
 a second capacitor configured to have one terminal thereof electrically connected to the sixth terminal;
 a fifth transistor comprising a fifth control terminal, a ninth terminal and a tenth terminal, the fifth transistor being configured to have the fifth control terminal thereof electrically connected to the third control terminal, the ninth terminal thereof electrically connected to the other terminal of the first capacitor, and the tenth terminal thereof electrically connected to the first reference voltage;
 a sixth transistor comprising a sixth control terminal, an eleventh terminal and a twelfth terminal, the sixth transistor being configured to have the sixth control terminal thereof electrically connected to the other terminal of the first capacitor and the eleventh terminal thereof for receiving the second reference voltage;
 a seventh transistor comprising a seventh control terminal, a thirteenth terminal and a fourteenth terminal, the seventh transistor being configured to have the seventh control terminal thereof electrically connected to the third control terminal, the thirteenth terminal thereof electrically connected to the twelfth terminal, and the fourteenth terminal thereof electrically connected to the first reference voltage; and
 an eighth transistor comprising an eighth control terminal, a fifteenth terminal and a sixteenth terminal, the eighth transistor being configured to have the eighth control terminal thereof electrically connected to the fourth control terminal and the thirteen terminal, the fifteenth terminal thereof electrically connected to the third control terminal and the other terminal of the second capacitor, and the sixteenth terminal thereof electrically connected to the first reference voltage.

12. The shift register circuit according to claim 1, wherein the first disable unit is configured to receive a control signal including a second reference voltage, the first disable unit comprising:
 a capacitor electrically connected between the first control terminal and the second terminal;
 a fifth transistor comprising a fifth control terminal, a ninth terminal and a tenth terminal, the fifth transistor being configured to have the fifth control terminal and the ninth terminal thereof electrically connected to the second reference voltage;
 a sixth transistor comprising a sixth control terminal, an eleventh terminal and a twelfth terminal, the sixth transistor being configured to have the sixth control terminal thereof electrically connected to the first control terminal, the eleventh terminal thereof electrically connected to the tenth terminal, and the twelfth terminal thereof electrically connected to the first reference voltage;

a seventh transistor comprising a seventh control terminal, a thirteenth terminal and a fourteenth terminal, the seventh transistor being configured to have the seventh control terminal thereof electrically connected to the tenth terminal and the thirteenth terminal thereof electrically connected to the second reference voltage;

an eighth transistor comprising an eighth control terminal, a fifteenth terminal and a sixteenth terminal, the eighth transistor being configured to have the eighth control terminal thereof electrically connected to the first control terminal, the fifteenth terminal thereof electrically connected to the fourteen terminal, and the sixteenth terminal thereof electrically connected to the first reference voltage;

a ninth transistor comprising a ninth control terminal, a seventeenth terminal and an eighteenth terminal, the ninth transistor being configured to have the ninth control terminal thereof electrically connected to the fourteen terminal and the second control terminal and the seventeenth terminal thereof electrically connected to the first control terminal; and a tenth transistor comprising a tenth control terminal, a nineteenth terminal and a twentieth terminal, the tenth transistor being configured to have the tenth control terminal thereof electrically connected to the ninth control terminal, the nineteenth terminal thereof electrically connected to the eighteenth terminal, and the twentieth terminal thereof electrically connected to the first reference voltage.

13. The shift register circuit according to claim 1, wherein the second disable unit is configured to receive a control signal including a second reference voltage, the second disable unit comprising:

a capacitor electrically connected between the third control terminal and the sixth terminal;

a fifth transistor comprising a fifth control terminal, a ninth terminal and a tenth terminal, the fifth transistor being configured to have the fifth control terminal and the ninth terminal thereof electrically connected to the second reference voltage;

a sixth transistor comprising a sixth control terminal, an eleventh terminal and a twelfth terminal, the sixth transistor being configured to have the sixth control terminal thereof electrically connected to the third control terminal, the eleventh terminal thereof electrically connected to the tenth terminal, and the twelfth terminal thereof electrically connected to the first reference voltage;

a seventh transistor comprising a seventh control terminal, a thirteenth terminal and a fourteenth terminal, the seventh transistor being configured to have the seventh control terminal thereof electrically connected to the tenth terminal and the thirteenth terminal thereof electrically connected to the second reference voltage;

an eighth transistor comprising an eighth control terminal, a fifteenth terminal and a sixteenth terminal, the eighth transistor being configured to have the eighth control terminal thereof electrically connected to the third control terminal, the fifteenth terminal thereof electrically connected to the fourteen terminal, and the sixteenth terminal thereof electrically connected to the first reference voltage;

a ninth transistor comprising a ninth control terminal, a seventeenth terminal and an eighteenth terminal, the ninth transistor being configured to have the ninth control terminal thereof electrically connected to the fourteen terminal and the fourth control terminal and the seventeenth terminal thereof electrically connected to the third control terminal, and a tenth transistor comprising a tenth control terminal, a nineteenth terminal and a twentieth terminal, the tenth transistor being configured to have the tenth control terminal thereof electrically connected to the ninth control terminal, the nineteenth terminal thereof electrically connected to the eighteenth terminal, and the twentieth terminal thereof electrically connected to the first reference voltage.

* * * * *